(12) United States Patent  
Eryu et al.

(10) Patent No.: US 9,815,170 B2  
(45) Date of Patent: Nov. 14, 2017

(54) METALLIC ABRASIVE PAD AND METHOD FOR MANUFACTURING SAME

(71) Applicants: NAGOYA INSTITUTE OF TECHNOLOGY, Nagoya-shi, Aichi (JP); SINTOKOGIO, LTD.

(72) Inventors: Osamu Eryu, Nagoya (JP); Eiji Yamaguchi, Toyokawa (JP)

(73) Assignees: NAGOYA INSTITUTE OF TECHNOLOGY, Nagoya-shi (JP); SINTOKOGIO, LTD., Nagoya-shi (JP)

( * ) Notice: Subject to any disclaimer, the term of this patent is extended or adjusted under 35 U.S.C. 154(b) by 58 days.

(21) Appl. No.: 14/904,832

(22) PCT Filed: Jun. 18, 2014

(86) PCT No.: PCT/JP2014/066169  
§ 371 (c)(1),  
(2) Date: Jan. 13, 2016

(87) PCT Pub. No.: WO2015/008572  
PCT Pub. Date: Jan. 22, 2015

(65) Prior Publication Data  
US 2016/0167193 A1    Jun. 16, 2016

(30) Foreign Application Priority Data  
Jul. 19, 2013 (JP) .................. 2013-150678

(51) Int. Cl.  
*B24B 37/24* (2012.01)  
*B22F 3/11* (2006.01)  
(Continued)

(52) U.S. Cl.  
CPC .............. *B24B 37/24* (2013.01); *B22F 3/11* (2013.01); *B24D 18/0009* (2013.01); *C22C 47/14* (2013.01); *H01L 21/02024* (2013.01)

(58) Field of Classification Search  
CPC ....... B24B 37/24; B22F 3/11; B24D 18/0009; C22C 47/14  
(Continued)

(56) References Cited

U.S. PATENT DOCUMENTS 2,958,593 A * 11/1960 Hoover ................... A47L 13/04  
451/532  
4,699,849 A * 10/1987 Das ......................... C22C 47/14  
428/379

(Continued)

FOREIGN PATENT DOCUMENTS

JP    H02-71968 A    3/1990  
JP    H07-266215 A    10/1995  
(Continued)

OTHER PUBLICATIONS

Sep. 9, 2014 International Search Report issued in International Patent Application No. PCT/JP2014/066169.  
(Continued)

*Primary Examiner* — George Nguyen  
(74) *Attorney, Agent, or Firm* — Oliff PLC

(57) ABSTRACT

A metallic abrasive pad for use in a smoothing operation applied to a worked surface of a workpiece by a catalyst-supported chemical machining method, the metallic abrasive pad including a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio.

16 Claims, 11 Drawing Sheets

(51) Int. Cl.
  *H01L 21/02* (2006.01)
  *C22C 47/14* (2006.01)
  *B24D 18/00* (2006.01)

(58) Field of Classification Search
  USPC .......................................... 451/28, 526–539
  See application file for complete search history.

(56) References Cited

U.S. PATENT DOCUMENTS

| | | | | |
|---|---|---|---|---|
| 4,715,150 | A * | 12/1987 | Takeuchi | B24D 11/00 451/527 |
| 5,030,233 | A * | 7/1991 | Ducheyne | A61F 2/30907 623/23.54 |
| 6,197,251 | B1 * | 3/2001 | Hashimoto | B22F 1/004 29/2 |
| 6,200,523 | B1 * | 3/2001 | Quick | B22F 3/002 419/2 |
| 6,379,816 | B1 * | 4/2002 | De Loose | A61L 31/022 165/134.1 |
| 2005/0282480 | A1 * | 12/2005 | Nelson | B24D 3/34 451/530 |
| 2007/0066186 | A1 * | 3/2007 | Annen | B24D 11/001 451/41 |
| 2007/0178812 | A1 | 8/2007 | Shimomura et al. | |
| 2008/0073222 | A1 | 3/2008 | Yamauchi et al. | |
| 2008/0220703 | A1 * | 9/2008 | Jung | B24D 11/02 451/539 |
| 2010/0009604 | A1 * | 1/2010 | Petersen | B24D 15/04 451/59 |
| 2010/0147463 | A1 | 6/2010 | Yamauchi et al. | |
| 2011/0223838 | A1 * | 9/2011 | Duescher | B24B 37/107 451/28 |
| 2012/0231691 | A1 | 9/2012 | Peyras-Carratte et al. | |
| 2012/0244649 | A1 | 9/2012 | Sano et al. | |
| 2015/0068680 | A1 | 3/2015 | Sano et al. | |
| 2017/0021473 | A1 * | 1/2017 | Wang | B24D 3/02 |

FOREIGN PATENT DOCUMENTS

| | | |
|---|---|---|
| JP | H09-267270 A | 10/1997 |
| JP | 2005-236200 A | 9/2005 |
| JP | 2008081389 A | 4/2008 |
| JP | 2008-254136 A | 10/2008 |
| JP | 2010-058170 A | 3/2010 |
| JP | 2011-129596 A | 6/2011 |
| JP | 4873694 B2 | 2/2012 |
| JP | 2013-508197 A | 3/2013 |

OTHER PUBLICATIONS

Sep. 9, 2014 Written Opinion of the International Searching Authority issued in International Patent Application No. PCT/JP2014/066169.

Mar. 2, 2015 International Preliminary Report on Patentability issued in International Patent Application No. PCT/JP2014/066169.

* cited by examiner

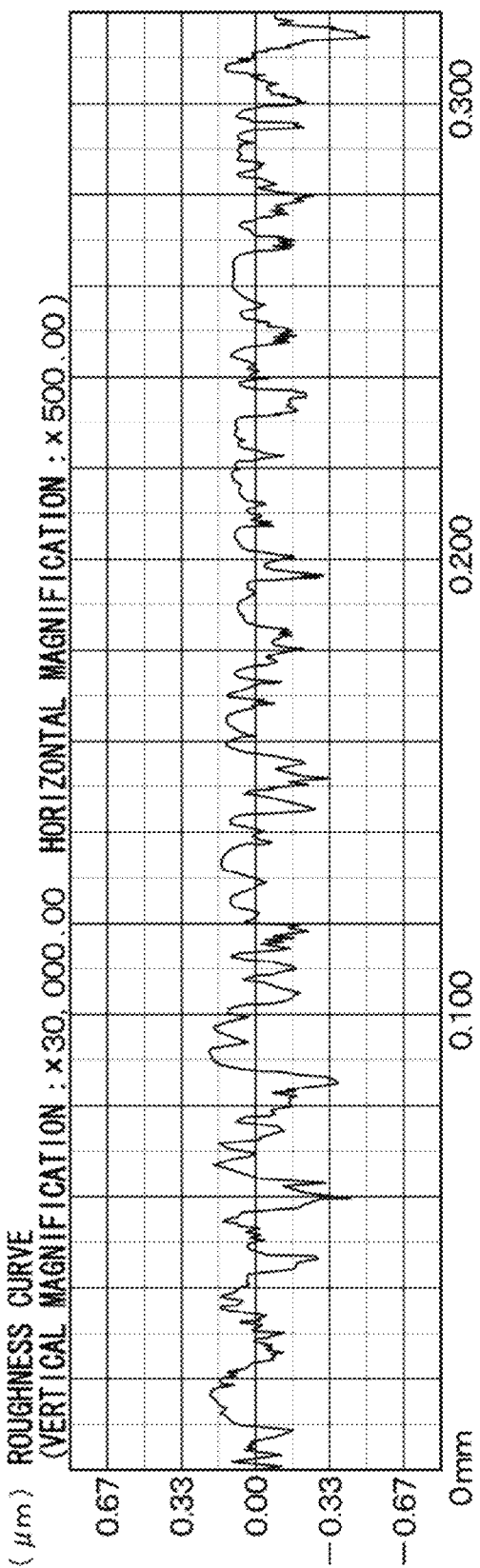

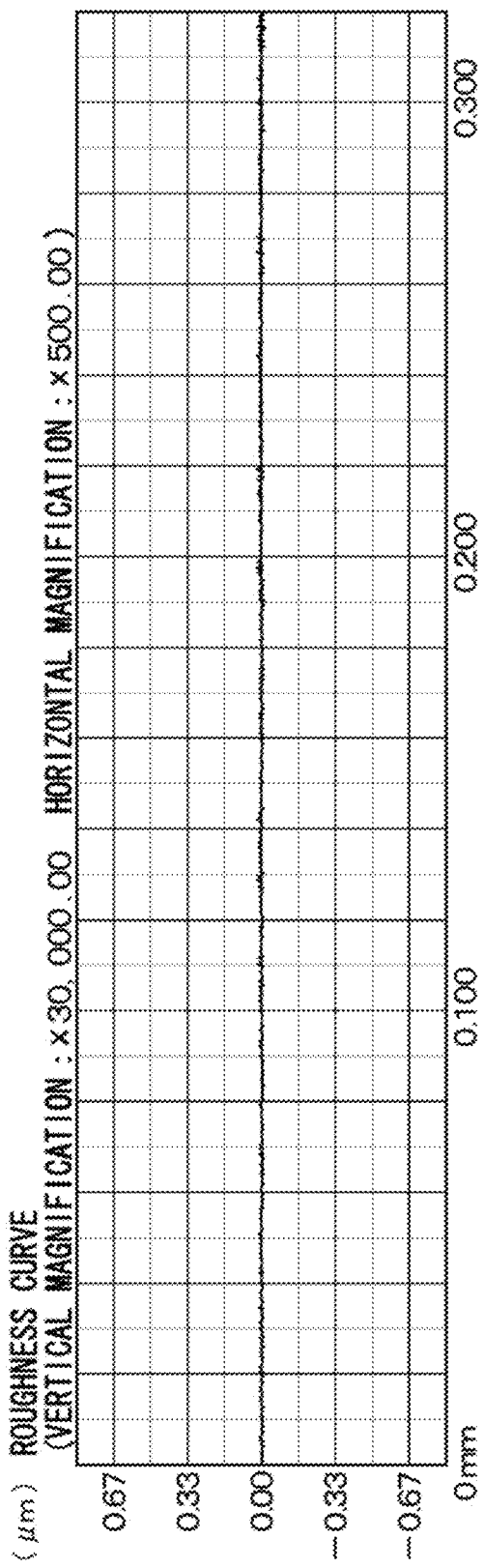

METALLIC ABRASIVE PAD AND METHOD FOR MANUFACTURING SAME

TECHNICAL FIELD

The present invention relates to a metallic abrasive pad for use in a smoothing operation applied to a surface of a difficult-to-machine material, a method for manufacturing the metallic abrasive pad, and a catalyst-supported chemical machining method using the metallic abrasive pad.

BACKGROUND ART

In order to advance energy-conservation in the power control of an automobile, a railway car, industrial equipment, and home electric appliances, etc., from the viewpoint of recent environmental and energy problems, higher performance is required of power-electronics equipment. For these power-electronics equipment, use has so far been made of silicon (hereinafter abbreviated as "Si"), as a power semiconductor-material, however, there has started a proposal to use a new power semiconductor-material, such as silicon carbide (hereinafter abbreviated as "SiC"), gallium nitride (hereinafter abbreviated as "GaN"), and diamond, etc., as a method for realizing further energy-conservation. These new power semiconductor-materials each had a problem in that the new power semiconductor-material was a material high in hardness, and fragile, as compared with SiC, being therefore regarded as the difficult-to-machine material.

There is available a catalyst-supported chemical machining method described in PTL 1, and PTL 2, respectively, as a conventional art whereby the respective surfaces of these difficult-to-machine materials are efficiently smoothed.

The method described in PTL 1 is a method whereby a workpiece is disposed in solution of an oxidizer, and a catalyst made of a transition metal is caused to approach the worked surface of a workpiece or come into extreme proximity thereto to thereby remove or elute a compound formed due to a chemical reaction occurring between an active species having high oxidizability, having occurred on the surface of the catalyst, and an atom on the surface of the workpiece to machine the workpiece. It is described in PTL 1 that an abrasive board is used the whole or a part of which is made up of the transition metal as a working example of this method.

The method described in PTL 2 is a method whereby a workpiece composed of GaN, and SiC, etc., is disposed in a process liquid in which a molecule containing a halogen, such as hydrofluoric acid, etc., is dissolved, and a catalyst and the workpiece are caused to undergo relative displacement, while rendering the catalyst made of molybdenum or a molybdenum compound to come into contact with the worked surface of the workpiece or to be in extreme proximity thereto, thereby machining the worked surface of the workpiece. In PTL 2, there is described use of a catalyst board composed of molybdenum or the molybdenum compound as a working example of this method.

Further, the method described in either of PTL 1 and PTL 2 is a method for polishing with the use of only the active species occurred from the oxidizer without using an abrasive grain.

CITATION LIST

Patent Literature

[PTL 1]
Japanese Patent No. 4873694 (Para. 0031, FIG. 7)

[PTL 2]
Japanese Unexamined Patent Application Publication No. 2008-81389 (Para. 0057, FIG. 25)

SUMMARY OF INVENTION

Technical Problem

With the catalyst-supported chemical machining method described as above, if the worked surface of the workpiece is away from the catalyst, an oxidation action of the active species cannot be obtained because hydroxyl radical and hydrogen radical, as the active species having high oxidizability, formed on the surface of the catalyst, can reside for a time period of only one millionth of a second, from occurrence to disappearance. For this reason, there is the need for causing the catalyst to approach the worked surface of the workpiece or come into extreme proximity thereto.

However, if an abrasive board is made up of a catalyst metal, as in the case of the conventional art described as above, a problem will occur in that a region on the worked surface of the workpiece, approaching a catalyst or coming into extreme proximity thereto, will decrease in number for the following reason.

More specifically, the abrasive board being a closely-packed bulky body made of metal, the rigidity thereof becomes higher. On the other hand, swells and microscopic asperities (roughness) on the order of a several tens of μms, in magnitude, normally exist on the worked surface of the workpiece. Accordingly, at a time when the worked surface of the workpiece and the surface of the board are put together by pressing, only the apex of each projection on the worked surface, comes into contact with the surface of the abrasive board, thereby causing miniscule gap to occur between the worked surface of the workpiece and the surface of the board. Consequently, if the abrasive board is made up of the catalyst metal, the region on the worked surface of the workpiece, coming into contact with a catalyst or coming into extreme proximity thereto, will decrease in number.

As a result, it is impossible to cause the active species having high oxidizability, having occurred on the surface of the catalyst, to efficiently act on the worked surface of the workpiece, so that a processing rate at the time of smoothing the workpiece becomes lower, thereby rendering processing time longer.

In view of those points described as above, it is therefore an object of the invention to provide a metallic abrasive pad capable of increasing the regions, on the worked surface of a workpiece, coming into contact with a catalyst or coming into extreme proximity thereto, and a method for manufacturing the metallic abrasive pad. Further, the invention has another object of providing a catalyst-supported chemical machining method, using the metallic abrasive pad.

Solution to Problem

To that end, according to a first aspect of the invention, there is provided a metallic abrasive pad for use in a smoothing operation applied to a worked surface of a workpiece by a catalyst-supported chemical machining method, the metallic abrasive pad comprising: a compression-formed compact of a metal fiber made of a transition-metal catalyst, wherein the metallic abrasive pad has a prescribed void ratio.

Since the abrasive pad according to the invention is made up of the metal fiber so as to have voids, the metal fiber existing on a surface of the abrasive pad can undergo elastic deformation. For this reason, upon the surface of the abrasive pad according to the invention and the worked surface of the workpiece being put together by pressing, the metal fiber undergoes deformation in response to microscopic asperities existing on the worked surface, whereupon a gap occurring between the surface of the abrasive pad and the worked surface can be reduced in size. By so doing, the region, on the worked surface, coming into contact with the catalyst or into extreme proximity thereto can be increased in number, as compared with the case of the conventional art. As a result, the active species having high oxidizability, having occurred on the surface of the catalyst, can be caused to efficiently act on the worked surface of the workpiece, and the operation rate of the smoothing processing can be increased.

Now, in order just to fill in the gap, it need only be sufficient to have an abrasive pad made up such that the abrasion surface thereof, in whole, can be deformed, however, if the abrasion surface, in whole, is deformed upon the worked surface being pressed against the abrasion surface, this will render the smoothing processing difficult to perform.

In contrast to the above, since the abrasive pad according to the first aspect of the invention includes the compression-formed compact composed of the metal fiber, the abrasive pad as a whole is high in rigidity, so that deformation of the abrasion surface in whole can be checked when the worked surface is pressed against the abrasion surface. Accordingly, use of the abrasive pad according to the invention enables a high-precision smoothing operation to be performed.

In a second aspect of the invention according to the first aspect, it is preferable that the metal fiber has a diameter falling in a range of 1 μm to 500 μm. In this case, it becomes easy to uniformly perform compression compact forming at high density at the time of manufacturing the compression-formed compact.

In a third aspect of the invention according to the third aspect, the void ratio is preferably set to not less than 10% and not more than 90%. In this case, the compression-formed compact can be easily formed, and the strength of the compression-formed compact can be secured.

In a fourth aspect of the invention according to the first aspect, it is preferable that the compression-formed compact preferably has a compression recovery ratio falling in a range of 90% to 100%.

Herein, the compression recovery ratio can be defined by the following equation in which T1 is a thickness of the metallic abrasive pad when an abrasion load 300 g/cm² is applied to the surface of the metallic abrasive pad for 10 sec, T2 is a thickness of the metallic abrasive pad when an abrasion load 1800 g/cm² is applied to the surface of the metallic abrasive pad for 10 sec, and T3 is a thickness of the metallic abrasive pad when the abrasion load 300 g/cm² is applied to the surface of the metallic abrasive pad for 10 sec after the abrasion load 1800 g/cm² is applied to the surface of the metallic abrasive pad for 10 sec.

$$\text{Compression Recovery Ratio (\%)} = (T3-T2)/(T1-T2) \times 100$$

If the compression recovery ratio is not less than 90%, it is possible to cause the metallic abrasive pad to sufficiently come into extreme proximity to the worked surface of a workpiece, or come into contact thereto halfway through a smoothing operation even in the case where swells and roughness exist on the worked surface of the workpiece prior to application of the smoothing operation.

In a fifth aspect of the invention according to the first aspect, the metal fiber can include metal or alloy, the metal being made of one species selected from a group of nickel, copper, iron, chromium, cobalt, and platinum, the alloy being made of combination of at least two species selected from the group. If the material of the metal fiber, that is, the species of the catalyst is selected so as to match up with the oxidation nature of the workpiece, it is possible to adjust a processing rate.

In a sixth aspect of the invention according to the first aspect, it is preferable that the compression-formed compact is preferably provided with a first metal fiber, and a second metal fiber differing in material from the first metal fiber. Thus, if the respective materials of the metal fibers, that is, the respective species of the catalysts are combined with each other to be thereby selected so as to match up with the oxidation nature of the workpiece, this will enable a processing rate to be adjusted.

In a second aspect of the invention according to the first aspect, it is preferable that the compression-formed compact is made up such that one face becomes an abrasion surface, and a cushion sheet having rubber elasticity is provided on the other face, wherein the other face is at the opposite side of said one face. With this feature, a processing pressure impressed on the worked surface, at the time of application of the catalyst-supported chemical machining, can be rendered uniform by the cushion sheet.

In an eighth aspect of the invention, there is provided a method for manufacturing the metallic abrasive pad according to any of the first to seventh aspect, the method including: a primary forming step for applying hot pressing to a metal fiber made of a transition-metal catalyst to form a primary formed compact; and a secondary forming step for applying isostatic pressing to the primary formed compact at an ordinary temperature to form a secondary formed compact, wherein the metal fiber is fixed to each other by means of sintering in the primary forming step, and in the secondary forming step, the isostatic pressing is applied in a state where one face of the primary formed compact is covered with a forming material that is undeformable at a hydrostatic pressure, and a remaining face of the primary formed compact is covered with a coating material that is deformable at a hydrostatic pressure.

Incidentally, in the case of manufacturing the metallic abrasive pad by singly applying a hot pressing or a hot isostatic pressing, in contrast to the present invention, the flatness of the formed compact undergoes deterioration, and the void ratio as well becomes non-uniform because of the effects of contraction of the formed compact, due to sintering, and distortion occurring to both the forming material and the formed compact, due to thermal expansion.

In contrast, with the present invention, the isostatic pressing is applied at an ordinary temperature hardly affected by the distortion occurring to both the forming material, and the formed compact, due to the thermal expansion after the metal fiber is sintered to each other by a hot pressing, so that high-flatness of the formed compact can be secured. Further, since a uniform pressure is applied from a side of the primary formed compact, adjacent to the coating material, toward the forming material, at the time of the isostatic pressing in the secondary forming step, the flat shape of the forming material can be precisely transferred to the primary formed compact, and portions of the metallic abrasive pad, at any site, can have a uniform void ratio.

Further, with the isostatic pressing in the secondary forming step, since a forming operation is applied at an ordinary temperature, there is no need for use of the hot isostatic pressing unit requiring much energy at a high cost. Accordingly, with respect to the forming material as well, there is no need for preparing a material particularly high in heat resistance, and for the forming material, a material somewhat harder than a material selected as the metal fiber is sufficient for use, so that the metallic abrasive pad can be manufactured at an industrially low cost.

In a ninth aspect of the invention, there is provided a catalyst-supported chemical machining method for applying a smoothing operation to a worked surface of a workpiece made of a difficult-to-machine material, comprising: putting an abrasion surface of the metallic abrasive pad according to any one of claims 1 to 7 and the worked surface together by pressing; and causing the workpiece and the metallic abrasive pad to undergo relative displacement, while feeding an oxidizer between the worked surface and the abrasion surface.

With this invention, the same effect as with the case of the first aspect of the invention can be obtained because the metallic abrasive pad in the first aspect is used.

In a tenth aspect of the invention according to the ninth aspect, a supplementary abrasive particle and the oxidizer are fed together.

According to the invention described as above, a surface modification layer of the workpiece, having occurred by the active species, can be efficiently removed because the supplementary abrasive particle is fed, as compared with the case where the processing is applied with the use of the active species only, as is the case with the conventional art. If, in an eleventh aspect, a material softer than the workpiece is used for the supplementary abrasive particle, it is possible to suppress occurrence of a linear trace on the workpiece. In addition, if, in a twelfth aspect of the invention, a material harder than the surface modification layer of workpiece is used as the supplementary abrasive particle, it is possible to increase processing rate.

The ninth to twelfth aspects of the invention is especially effective if, in the thirteenth aspect of the invention, the difficult-to-machine material is any one selected from the group consisting of SiC, GaN, diamond, sapphire.

In a fourteenth aspect of the invention according to the ninth to thirteenth aspects, solution of one species selected from the group consisting of pure water, aqueous hydrogen peroxide, oxalic acid, or hydrofluoric acid, or a mixed solution composed of combination of at least two species selected from the group described as above, can be used for the oxidizer. If the species of the oxidizer is selected so as to match up with the oxidation nature of the workpiece, this will enable a processing rate to be adjusted. With this feature, processing accuracy can be easily adjusted.

BRIEF DESCRIPTION OF DRAWINGS

FIG. 10(b) shows a roughness curve of the SiC wafer surface after machining is applied to the SiC wafer, using a metallic abrasive pad according to working example 1.

FIG. 10(c) shows a roughness curve of the SiC wafer surface after further machining is applied to the SiC wafer, using the metallic abrasive pad according to working example 1.

DESCRIPTION OF EMBODIMENTS

Embodiments of the invention are described below with reference to the accompanying drawings.

(First Embodiment)

Figure 1:
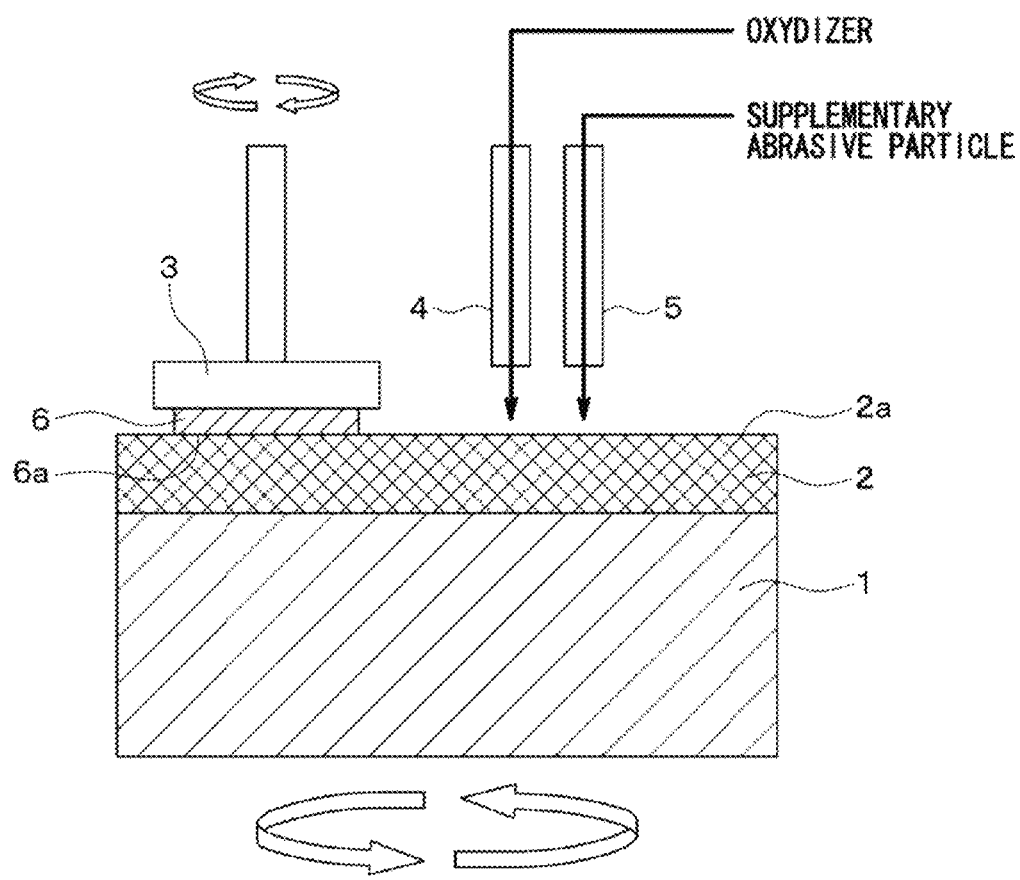
FIG. 1 is a conceptual view showing a general makeup of a catalyst-supported chemical machining unit according to a first embodiment of the invention.

First, there are described both a catalyst-supported chemical machining unit and a catalyst-supported chemical machining method, according to the first embodiment of the invention. In FIG. 1, there is depicted a conceptual view of a chemical machining unit in which a catalyst-supported chemical machining with the use of the metallic abrasive pad according to the invention is executed.

The chemical machining unit is provided with a board 1, a metallic abrasive pad 2, a holder 3, a first nozzle 4, and a second nozzle 5, as shown in FIG. 1.

The board 1 has an upper surface which is flat, being rotatable around a rotation shaft perpendicular to the upper surface. The metallic abrasive pad 2 is attached to the upper surface of the board 1. The metallic abrasive pad 2 has an abrasion surface 2a wider in area than a worked surface 6a of a workpiece 6. The holder 3 holds the workpiece 6 made of a difficult-to-machine material. The holder 3 is rotatable around the rotation shaft thereof, provided so as to be in parallel with the rotation shaft of the board 1, and eccentrically thereto. In this connection, both the board 1 and the holder 3 are rotatable, however, the chemical machining unit may be made up such that only one of these elements can rotate. Further, the respective rotation directions of the board 1 and the holder 3 may be either the same or differ from each other.

The first nozzle 4 is a first feeder for feeding an oxidizer between the abrasion surface 2a of the metallic abrasive pad 2 and the worked surface 6a of the workpiece 6. The second nozzle 5 is a second feeder for feeding a supplementary abrasive particle between the abrasion surface 2a of the metallic abrasive pad 2 and the worked surface 6a of the workpiece 6.

By "a difficult-to-machine material" in the present description is meant a material which is difficult to machine under a mechanically strong condition because the material is high in hardness and fragile. By "high in hardness" is meant higher in hardness than Si, and so forth. In the case where the difficult-to-machine material is any material selected from the group consisting of SiC, GaN, diamond, sapphire, and ruby, among those difficult-to-machine materials, the industrial value thereof is particularly high. However, a material making up the workpiece is not limited to the difficult-to-machine material, and any material that can be machined by the catalyst-supported chemical machining method will suffice.

The oxidizer, may be solution of one species selected from the group consisting of pure water, aqueous hydrogen peroxide, oxalic acid, and hydrofluoric acid, or a mixed solution made up of combination of at least two species selected from the group described as above. The oxidizer is selected from among plural species of oxidizers capable of causing an optimum catalytic reaction to occur to the difficult-to-machine material to be machined.

The supplementary abrasive particle is a supplementary machining material for use in removal of a surface modification layer formed on the surface of the workpiece, as described later on. For the supplementary abrasive particle, a particle softer than the workpiece is used, and more preferably, a particle softer than the workpiece, and harder than the surface modification layer of the workpiece is used. If the hardness of the supplementary abrasive particle is set so as to be lower than that of the workpiece, the surface modification layer can be removed without damaging the surface of the workpiece, thereby enabling a new catalytic reaction to be fostered. If the hardness of the supplementary abrasive particle is set so as to be higher than that of the surface modification layer, and lower than that of the workpiece, this will enable machining to be executed at a high machining rate without damaging a workpiece material. For the material of the supplementary abrasive particle, for example, alumina, boron carbide, and silica, etc can be used. The particle size of the supplementary abrasive particle may be selected depending on the material of the workpiece material, or smoothness obtained after machining, and there is no particular limitation thereto.

Figure 2A:
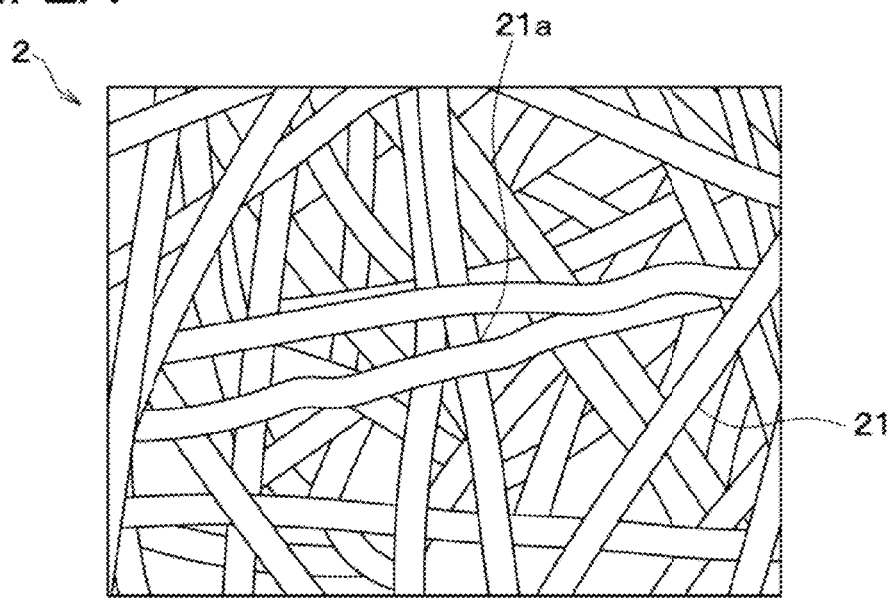
FIG. 2(a) is a schematic diagram of a metallic abrasive pad shown in FIG. 1, being a sectional view of the metallic abrasive pad, in parallel with an abrasion surface thereof.
Figure 2B:
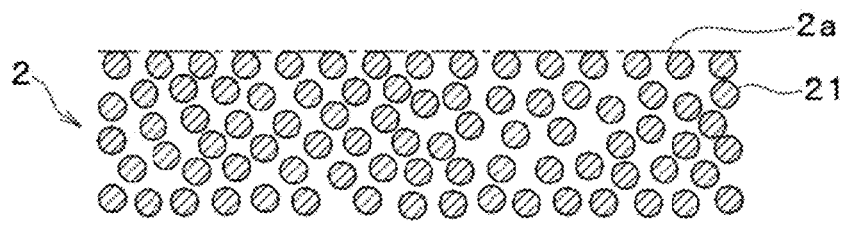
FIG. 2(b) is schematic diagram of the metallic abrasive pad shown in FIG. 1, being a sectional view of the metallic abrasive pad, perpendicular to the abrasion surface.

Next, the metallic abrasive pad 2 is described hereunder. FIG. 2(a) shows a section in parallel with the abrasion surface 2a of the metallic abrasive pad 2, and FIG. 2(b) shows a section perpendicular to the abrasion surface 2a of the metallic abrasive pad 2.

The metallic abrasive pad 2 is made up of a compression-formed compact of a metal fiber 21 made of a transition-metal catalyst, having a prescribed void ratio. The compression-formed compact is formed into a compact by applying heating and compression to the metal fiber in a flocculent state. The metal fiber in the flocculent state is made up of one length of the metal fiber or plural lengths of the metal fibers. Further, a method for manufacturing the metallic abrasive pad 2 is described in detail later on in this description.

More specifically, with the metallic abrasive pad 2, the metal fiber(s) 21 intersects with the metal fiber(s) 21 to be sintered together at an intersection spot 21a, whereupon the metal fiber(s) 21 are fixed to the metal fiber(s) 21, as show in FIG. 2(a). Further, the abrasion surface 2a of the metallic abrasive pad 2 has high flatness, as show in FIG. 2(b). In other words, the metal fiber(s) 21 is arranged in such a way as to form a flat surface on the abrasion surface 2a. Still further, the metallic abrasive pad 2 is made up of the metal fiber(s) 21 substantially uniform in diameter, as shown in FIG. 2(a), and FIG. 2(b).

The diameter of the metal fiber 21, serving as the raw material of the metallic abrasive pad 2, falling in a range of 1 to 500 μm is suitable. If the diameter of the metal fiber 21 is in excess of 500 μm, the strength of the metal fiber 21, on its own, will be excessively high, so that it becomes difficult to uniformly form a high-density compression-formed compact. Unless the metal fiber 21 can be turned into the compression-formed compact at high-density, it is impossible to satisfactorily obtain the effect of increasing a surface area for causing the occurrence of the catalytic reaction, that is, one of the objects of transforming the raw material into a fiber, thereby causing a decrease in the advantage of using the metal fiber 21 as the raw material. Since it is possible these days to manufacture a metal fiber extremely small in diameter, up to 1 μm in diameter, by a focused drawing method, the metal fiber 21, not less than 1 μm in diameter, can be put to use. However, the diameter of the metal fiber 21, not less than 10 μm, is more preferable for the following reason. In the case where the diameter of the metal fiber 21 is less than 10 μm, it takes a high cost to manufacture the metal fiber 21 as the raw material. Furthermore, in this case, the activity of the metal fiber 21 being excessively high upon heating the same in a compact-forming step as described later on, the metal fiber 21 is oxidized by oxygen in the atmosphere.

Further, "the diameter of the metal fiber 21" in the present description means an equivalent-circle diameter, as calculated on the basis of a sectional area of the metal fiber 21. Further, the diameter of the metal fiber 21, described as above, indicates an average value of diameters, each of the diameters being a diameter per one length of the metal fiber for use as the raw material. In the case where the metallic abrasive pad 2 is manufactured by use of plural lengths of the metal fibers 21, a diameter falling in a range of 1 to 500 µm, with respect to all the plural lengths of the metal fibers 21, is suitable for use. Further, because the diameter of the metal fiber 21 after manufacturing of the metallic abrasive pad 2 is substantially equal to the diameter of the metal fiber 21 before manufacturing of the metallic abrasive pad 2, the diameter of the metal fiber 21, described as above, means the diameter of the metal fiber 21 making up the metallic abrasive pad 2.

The void ratio of the metallic abrasive pad 2 is in a prescribed range neither too small nor too large. If the void ratio is too small, this will prevent the metal fiber 21 from undergoing an elastic deformation, so that when the metallic abrasive pad 2 and the workpiece 6 are put together by pressing, the region, existing on the worked surface 6a, coming into contact with a catalyst or coming into extreme proximity thereto, will be decreased in number. Further, if the void ratio is too small, this will render it difficult for the abrasion surface 2a of the metallic abrasive pad 2, opposite to the worked surface 6a of the workpiece 6, to sufficiently hold the oxidizer and the supplementary abrasive particle, for use in processing. On the other hand, if the void ratio is too large, this will prevent a reaction surface area for causing the occurrence of the active species having oxidizability from being enlarged.

More specifically, the void ratio of the metallic abrasive pad 2 is set to fall in a range of 10 to 90%. The reason for this is because the result of experiments conducted by the inventor, whereby various compression-formed compacts were machined so as to have a variety of void ratios, indicated that the void ratio less than 10% was difficult to implement, whereas if the void ratio was in excess of 90%, it was impossible to maintain the shape of the compression-formed compact upon removal of a forming tool.

A compression recovery ratio of the metallic abrasive pad 2, falling in a range of 90 to 100%, is suitable although the compression recovery ratio varies depending on the diameter of the metal fiber, and a formation-density of the formed compact, at the time of forming a compression-compact. The reason for this is because, if the compression recovery ratio is less than 90%, it will be difficult to cause the whole surfaces of the metallic abrasive pad and the workpiece, respectively, to come into uniform contact with each other at the time of machining being applied to both the metallic abrasive pad and the workpiece, in a pressed state, whereupon localized contact will result.

The metal fiber is, for example, made up of metal or alloy, wherein the metal is made of one species selected from a group of nickel, copper, iron, chromium, cobalt, and platinum, and the alloy is made of combination of at least two species selected from the group consisting of titanium, nickel, copper, iron, chromium, cobalt, and platinum. The material of the metal fiber is selected from among plural species of metal stocks that are capable of causing an optimum catalytic reaction to occur to a difficult-to-machine material to be machined. With the present embodiment, all the qualities (materials) of the metal fiber making up the compression-formed compact are identical to each other.

Figure 3:
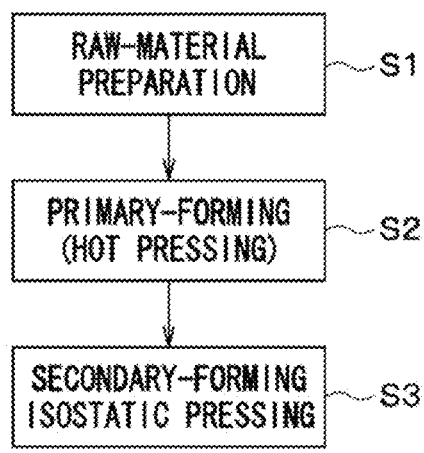
FIG. 3 is a flow chart showing the steps of manufacturing the metallic abrasive pad according to the first embodiment of the invention.

Next, there is described a method for manufacturing the metallic abrasive pad 2. FIG. 3 shows a flow chart depicting the steps of manufacturing the metallic abrasive pad 2. The metallic abrasive pad 2 is manufactured by taking a raw-material preparation step S1, a primary forming step S2, and a secondary forming step S3, as shown in FIG. 3.

In the raw-material preparation step S1, a metal fiber composed of a transition-metal catalyst, serving as the raw material of the metallic abrasive pad 2, is prepared. The numbers of the metal fibers prepared at this point in time may be either plural lengths or one length, and in the case of using the plural lengths, relatively long ones are preferably used. This is recommendable in order to prevent dropping of the metal fiber from occurring at the time of the smoothing operation according to the catalyst-supported chemical machining method.

In the primary forming step S2, the metal fiber is subjected to the hot pressing to thereby form a primary formed compact (a precursor compact). At this point in time, the metal fiber is flocculently disposed inside a forming tool to thereby apply heating and pressing thereto.

A heating temperature is a temperature at which a contact spot of the metal fibers intersecting each other is sintered to be thereby solidified. For example, in the case where the metal fiber is made of titanium, the heating temperature is set to not lower than 700° C. and not higher than 1000° C. If a compact-forming temperature is lower than 700° C., deformation of the metal fiber will be insufficient, and the density of the compact will be uneven, so that it is not possible to obtain a formed compact that can be used for the metallic abrasive pad 2. If the compact-forming temperature is in excess of 1000° C., the metal fibers are locally sintered to each other to be fused and connected before undergoing contraction. As a result, the surface area of the formed compact will become smaller, and the effect of increasing a catalytic reaction area, as intended by use of the metal fiber as the raw material, will be reduced. Further, if the sintering of the formed compact excessively proceeds, the formed compact itself will undergo contraction in size, and it will become difficult to secure the size accuracy of the formed compact, so that it becomes difficult to obtain the shape of the metallic abrasive pad 2, capable of securing intimate contact with the workpiece.

Further, for a hot pressing method, use is preferably made of a vacuum hot pressing method capable of checking the oxidation of the metal fiber making up the precursor compact in the case where the metal fiber is susceptible to oxidation, and having no risk of occurrence of poor machining, caused by entrainment of air into the formed compact. By so doing, it is possible to obtain the formed compact large in a surface area where a catalytic reaction is caused to occur, and excellent in size accuracy.

Figure 4:
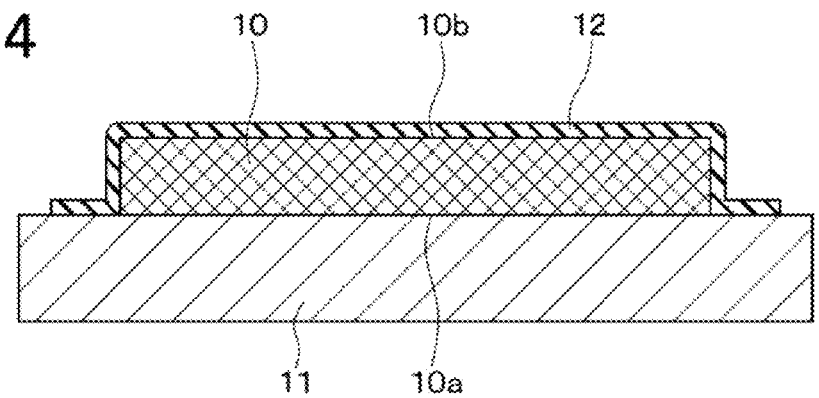
FIG. 4 is a sectional view showing the state of a primary formation compact at the time of applying isostatic pressing in a secondary forming step.

In the secondary forming step S3, the primary formed compact is subjected to a isostatic pressing at an ordinary temperature to thereby form a secondary formed compact. FIG. 4 shows a state of the primary formed compact at a time when a isostatic pressing is applied in the secondary forming step S3. More specifically, the isostatic pressing is applied to the primary formed compact in a state in which one face 10a of the primary formed compact 10 is covered with a forming material 11 that is undeformable at a hydrostatic pressure at the time of the isostatic pressing, and remaining faces of the primary formed compact 10, including another face 10b, are covered with a coating material 12 that is deformable, as shown in FIG. 4. By so doing, the one face 10a of the primary formed compact 10 is rendered flatter. The one face 10a of the primary formed compact 10 will serve as the abrasion surface 2a of the metallic abrasive pad 2.

For the forming material 11, a forming material having high rigidity, composed of iron, aluminum, and glass, etc can be used. For the coating material 12, a sheet-like material composed of an elastic material such as rubber, and so forth can be used. In the secondary forming step S3, there is no need at all for preparing a special heat-resistant material for use in a forming tool, such a material as used in the hot isostatic pressing. By "an ordinary temperature" described as above is meant the temperature of a material in unheated state.

Now, in contrast to the present embodiment, if the metallic abrasive pad 2 is manufactured by singly applying the hot pressing or the hot isostatic pressing, the flatness of the formed compact will be deteriorated because of the effects of contraction of the formed compact, due to sintering, and distortion occurring to the forming material as well as the formed compact, due to thermal expansion, whereupon the void ratio as well will become non-uniform.

In contrast to this, with the present embodiment, the metal fibers are sintered to each other by hot pressing, and subsequently, the isostatic pressing hardly affected by the distortion, due to the thermal expansion of the forming material as well as the formed compact is applied at an ordinary temperature, so that it is possible to secure high flatness of the formed compact. Further, with the isostatic pressing in the secondary forming step S3, since a uniform pressure is applied from a side of the primary formed compact, adjacent to the coating material 12, toward the forming material 11, the flat shape of the forming material 11 can be precisely transferred to the compact, and portions of the metallic abrasive pad 2, at any site, can have a uniform void ratio.

Furthermore, with the isostatic pressing in the secondary forming step S3, since compact-forming is executed at an ordinary temperature, there is no need for use of the hot isostatic pressing unit requiring much energy at a high cost. Accordingly, with respect to the forming material 11 as well, there is no need for preparing a material particularly high in heat resistance, and for the forming material 11, use of a material somewhat harder than the material selected, as the metal fiber, is sufficient, so that the metallic abrasive pad can be manufactured at an industrially low cost.

Next, there is described below the catalyst-supported chemical machining method, using the machining unit described as above. The worked surface 6a of the workpiece 6 and the abrasion surface 2a of the metallic abrasive pad 2 are put together by pressing, while driving the board 1 and the holder 3, respectively, for rotation. Then, the oxidizer from the first nozzle 4, and the supplementary abrasive particle from the second nozzle 5 are each fed between the worked surface 6a and the abrasion surface 2a.

At this point in time, an active species having high oxidizability occurs from the oxidizer, on the surface of the metal fibers making up the metallic abrasive pad 2. For example, in the case where the metal fiber is composed of titanium, and hydrogen peroxide is used as the oxidizer, hydroxyl radical occurs due to Fenton reaction. The surface layer of the worked surface 6a is modified into an oxidized layer by the active species, that is, a surface modification layer is formed on the worked surface 6a. Subsequently, the surface modification layer is scraped off by the supplementary abrasive particle. Thus, the smoothing processing is applied to the worked surface 6a of the workpiece 6.

Figure 5A:
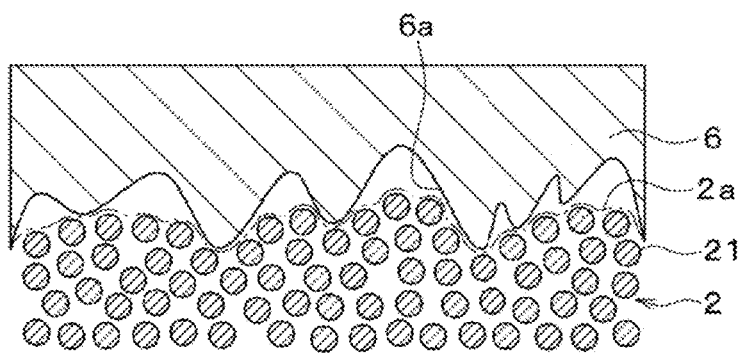
FIG. 5(a) is an enlarged view showing a portion of a workpiece, in the vicinity of a worked surface of the workpiece when each metallic abrasive pad according to the first embodiment and the workpiece are put together by pressing.
Figure 5B:
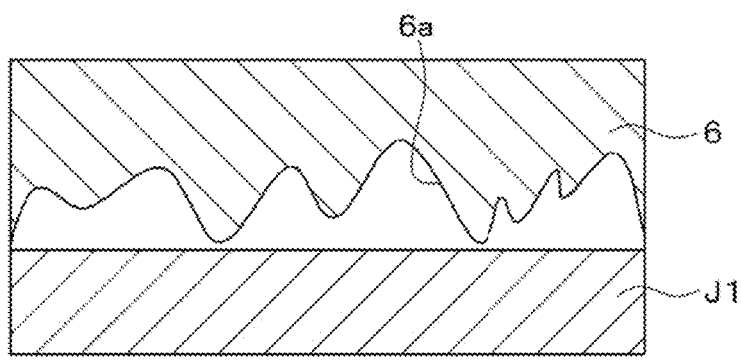
FIG. 5(b) is an enlarged view showing a portion of a workpiece, in the vicinity of a worked surface of the workpiece when each metallic abrasive pad according to working example 1 and the workpiece are put together by pressing.
Figure 5C:
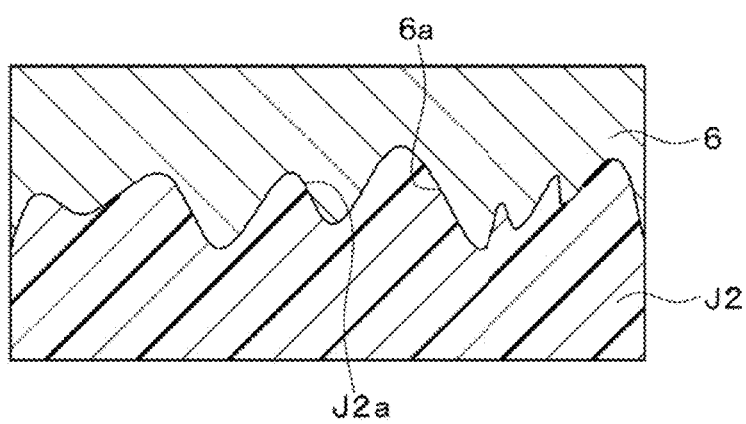
FIG. 5(c) is an enlarged view showing a portion of a workpiece, in the vicinity of a worked surface of the workpiece when each metallic abrasive pad according to working example 2 and the workpiece are put together by pressing.

Next, the main feature of the present embodiment is described below. FIGS. 5(a), 5(b), and 5(c) each show an enlarged vies of a portion of the workpiece, in the vicinity of the worked surface, when each of various abrasive pads and the workpiece are put together by pressing, in the respective cases of the present embodiment, comparative example 1, and comparative example 2.

The comparative example 1 shown in FIG. 5(b) is an example in which an abrasive board J1 composed of the catalyst metal is used, described under the column Technical Problem. Upon the abrasive board J1 and the workpiece 6 being put together by pressing, the abrasive board J1 does not undergo deformation in response to microscopic asperities existing on the worked surface 6a of the workpiece 6 because of high rigidity of the abrasive board J1. For this reason, a miniscule gap is caused to occur between the worked surface 6a and the surface of the abrasive board J1.

In contrast, the metallic abrasive pad 2 according to the present embodiment is made up of the metal fibers 21, having voids, so that the metal fibers existing on the abrasive pad surface 2a can undergo elastic deformation. For this reason, if the abrasive pad surface 2a and the worked surface 6a of the workpiece 6 are put together by pressing, the abrasive pad surface 2a is deformed in response to the microscopic asperities existing on the worked surface 6a, thereby enabling a gap occurring between the abrasive pad surface 2a and the worked surface 6a to be smaller, as shown in FIG. 5(a). In other words, the metal fiber 21 in contact with each projection of the worked surface 6a, on the metallic abrasive pad surface 2a, is pressed, whereupon a portion of the metal fiber 21, opposed to a recess of the worked surface 6a, enters the recess. By so doing, a region, on the worked surface 6a, coming into contact with the catalyst or into extreme proximity thereto can be increased in number, as compared with the working example 1. As a result, the active species having high oxidizability, having occurred on the surface of the catalyst, can be caused to efficiently act on the worked surface of the workpiece. In short, the surface modification layer can be speedily formed on the worked surface 6a, and the processing rate of the smoothing processing can be increased.

The comparative example 2 shown in FIG. 5(c) is an example in which an abrasive pad J2 having high flexibility is used. The abrasive pad J2 is not composed of the catalyst metal, but the same is made up of a non-woven fabric made of, for example, polyurethane resin. In the case where the abrasive pad J2 according to comparative example 2 and the workpiece 6 are put together by pressing, an abrasive pad surface J2a is deformed in response to microscopic asperities existing on the worked surface 6a, whereupon a gap between the abrasive pad surface J2a and the worked surface 6a can be eliminated.

In this case, however, the abrasive pad surface J2a undergoes deformation upon the same being pressed by the worked surface 6a because of excessively high flexibility of the abrasive pad J2. More specifically, if the abrasive pad surface J2a is larger than the worked surface 6a, a portion of the abrasive pad surface J2a, at sites opposite to the edge of the worked surface 6a, will be deformed, upon the abrasive pad surface J2a being pressed by the worked surface 6a. Accordingly, application of the smoothing processing to the worked surface 6a will become difficult to implement.

In contrast thereto, the metallic abrasive pad 2 according to the present embodiment is made up of the compression-formed compact of the metal fiber 21, and therefore, the metallic abrasive pad 2 as a whole has a high rigidity, so that it is possible to check the deformation of the abrasion surface 2a, occurring upon the worked surface 6a being pressed against the abrasion surface 2a. In other words, upon the worked surface 6a being pressed against the abrasion surface 2a, the abrasion surface 2a can maintain high flatness. Accordingly, the use of the metallic abrasive pad 2 according to the present embodiment enables high-precision smoothing processing to be applied.

Further, with the metallic abrasive pad 2 according to the present embodiment, the catalyst metal is in a fiber-like shape, 500 μm or less, in diameter, having voids around a fiber, so that a reaction surface area for causing the occurrence of the active species having oxidizability can be rendered larger as compared with the case where the catalyst metal is in a dense bulky-shape.

Still further, with the metallic abrasive pad 2 according to the present embodiment, since the voids exist on the abrasion surface, the abrasion surface can hold both the oxidizer and the supplementary abrasive particle, in amount sufficient for application of the processing to the worked surface of the workpiece.

Yet further, with the catalyst-supported chemical machining method according to the present embodiment, not only the oxidizer but also the supplementary abrasive particle are fed between the worked surface 6a and the abrasion surface 2a to thereby remove the surface modification layer of the workpiece 6. For this reason, with the present embodiment, the surface modification layer of the workpiece can be efficiently removed, as compared with the case where the processing is executed with the use of the active species only, as is the case with the conventional art.

(Second Embodiment)

Figure 6:
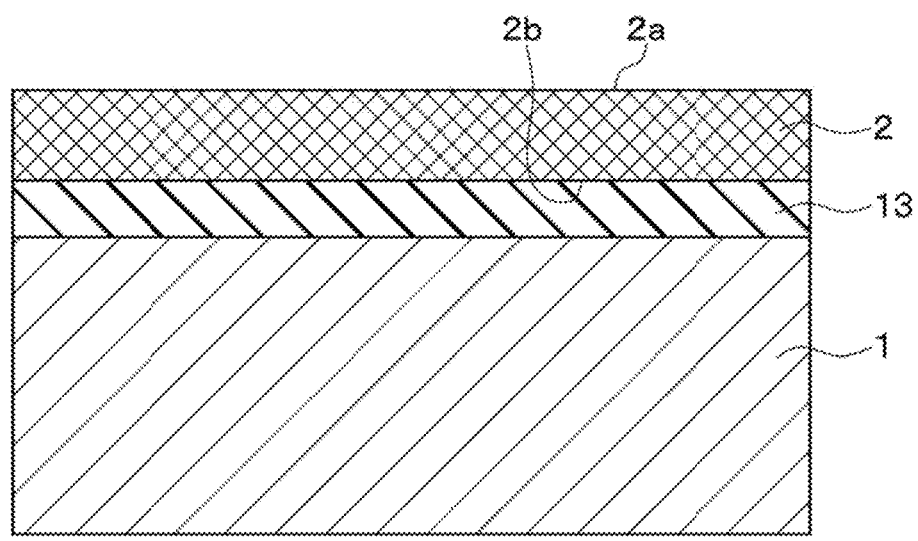
FIG. 6 is a sectional view showing a metallic abrasive pad as well as a board of a catalyst-supported chemical machining unit according to a second embodiment of the invention.

In FIG. 6, there is shown a metallic abrasive pad as well as a board, in a catalyst-supported chemical machining unit according to a second embodiment of the invention.

With the first embodiment, the metallic abrasive pad 2 is attached directly to the board 1, however, the metallic abrasive pad 2 may be attached to the board 1 with a cushion sheet 13 having rubber elasticity interposed therebetween. More specifically, the cushion sheet 13 may be provided on a surface (the other face) 2b, on the opposite side of the abrasion surface (one face) 2a of the metallic abrasive pad 2.

By so doing, a processing pressure impressed on the worked surface 6a, at the time of application of the catalyst-supported chemical machining, can be rendered uniform by the cushion sheet 13.

(Third Embodiment)

The respective qualities of metal fibers making up a compression-formed compact are not limited to the case where all the metal fibers are of the same material, and the metal fibers may differ in material from each other. More specifically, the compression-formed compact may be provided with the metal fibers including a first metal fiber, and a second metal fiber differing in material from the first metal fiber (refer to working example 3).

If the respective qualities of the metal fibers, that is, plural spices of the catalysts, are combined before selected so as to match up with the oxidation nature of the workpiece, this will enable the processing rate to be adjusted.

(Other Embodiments)

(1) With the first embodiment, the supplementary abrasive particle is fed from the second nozzle 5 at the time of application of the catalyst-supported chemical machining, however, the catalyst-supported chemical machining may be applied without feeding the supplementary abrasive particle, as is the case with conventional art described in PTL 1, and PTL 2, respectively.

(2) With the first embodiment, the catalyst-supported chemical machining unit is structured so as to drive both the workpiece 6 and the metallic abrasive pad 2 for a rotational movement, however, the unit may be structured so as to drive at least either of the workpiece 6 and the metallic abrasive pad 2 for a linear reciprocating-motion. In short, if the catalyst-supported chemical machining unit is structured so as to cause the workpiece 6 and the metallic abrasive pad 2 to be driven for relative displacement, this will suffice.

(3) With the first embodiment, the metallic abrasive pad 2 is made up of the metal fiber 21 having a diameter of one species in magnitude, however, the metallic abrasive pad 2 may be made up of the metal fibers 21 having respective diameters of plural species in magnitude. Even in this case, the diameter of one length of the metal fiber 21 is preferably in the range of 1 to 500 μm.

(4) The respective embodiments described as above are not unrelated to each other, but can be combined with each other as appropriate unless combination is impossible. Furthermore, with respect to the respective embodiments, it is needless to say that elements constituting the embodiment are not necessarily essential unless, for example, specified as essential, in particular, and obviously considered as essential in principle.

WORKING EXAMPLES

Working examples of the invention are described below. Each of working examples 1 through 3 is an example in which a metallic abrasive pad is manufactured. Working example 4 is an example showing a smoothing operation according to the catalyst-supported chemical machining method, using a metallic abrasive pad.

Working Example 1

A metallic abrasive pad having a void ratio at 36% was manufactured by the method for manufacturing the metallic abrasive pad described in the first embodiment of the invention. A specific condition is described below.

Metal fibers shown in Table 1 were prepared (the raw-material preparation step S1). The metal fibers, as prepared, were substantially uniform in diameter.

TABLE 1

| Quality of metal fiber | Pure titanium |
|---|---|
| Diameter of metal fiber | 20 μm |

Subsequently, a precursor compact was formed under a compact-forming condition shown in Table 2 by a uniaxial vacuum hot-press (the primary forming step S2). At this point in time, the target density of the precursor compact was set by a reverse operation of a compressibility ratio of the secondary forming step, and a target void ratio of a metallic abrasive pad.

More specifically, if the target void ratio of the metallic abrasive pad was 36%, a compression compact-forming stroke in the uniaxial vacuum hot-press was adjusted such that the void ratio will become 45%, which is slightly higher than the target. The reason for setting the void ratio to a void ratio slightly higher than the target void ratio is because there is the need for the target void ratio taking the formability of a isostatic pressing for final compact-forming into consideration. If the density of a formed compact after the uniaxial vacuum hot-pressing is excessively high, a deformation volume in the isostatic pressing will decrease, thereby rendering it difficult to even out the respective densities of the formed compacts. Conversely, if the density of the formed compact after the uniaxial vacuum hot-pressing is excessively low, the deformation volume in the isostatic pressing will increase, thereby preventing the formed compact from being compressed to a target formation density, so that a compressive residual stress occurs to the formed compact to thereby cause the formed compact to undergo a large deformation.

TABLE 2

| Compact-forming method | Uniaxial vacuum hot-press |
|---|---|
| Forming-tool | Flat-plane forming-tool, made of steel |
| Formation temperature | 800° C. |
| Formation time | 0.5 hr |

Subsequently, a metallic abrasive pad was formed into a compact by the isostatic press (the secondary forming step S3). A compact-forming pressure in the isostatic press at this point in time was set according to the void ratio of the metallic abrasive pad, as the final object, the diameter of a titanium fiber, and the density of the precursor compact after the uniaxial vacuum hot-pressing.

TABLE 3

| Compact-forming method | isostatic press (ordinary temperature) |
|---|---|
| Forming tool 11 | Plane glass |
| Coating material 12 | Rubber sheet |
| Forming pressure | 2 MPa |
| Forming time | 60 sec |

Figure 7:
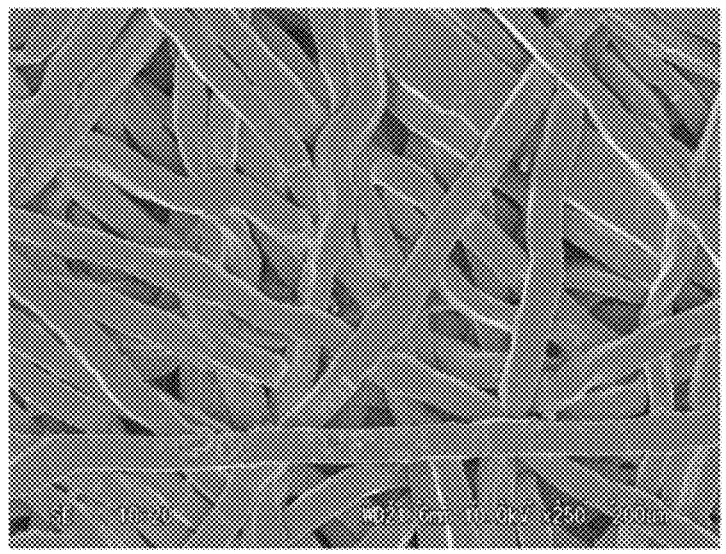
FIG. 7 is the photograph of a scanning electron microscope image of a metallic abrasive pad made up of a titanium fiber 20 μm in diameter, having a void ratio at 36%, according to the working example 1.

FIG. 7 shows the photograph of a scanning electron microscope image of the metallic abrasive pad manufactured as above, having a void ratio at 36%. It can be confirmed from FIG. 7 that the surface of the metallic abrasive pad, as formed, was uniform in density. Further, with respect to the metallic abrasive pad having the void ratio at 36%, a compression recovery ratio was measured, and as a result, the compression recovery ratio was found at 99%.

Working Example 2

A metallic abrasive pad having a void ratio at 78% was manufactured by the same method as in the case of Working Example 1. Further, a compact-forming stroke in the uniaxial vacuum hot-press was adjusted such that the void ratio of the metallic abrasive pad will be at 78%, and a forming pressure in the isostatic press was adjusted.

Figure 8:
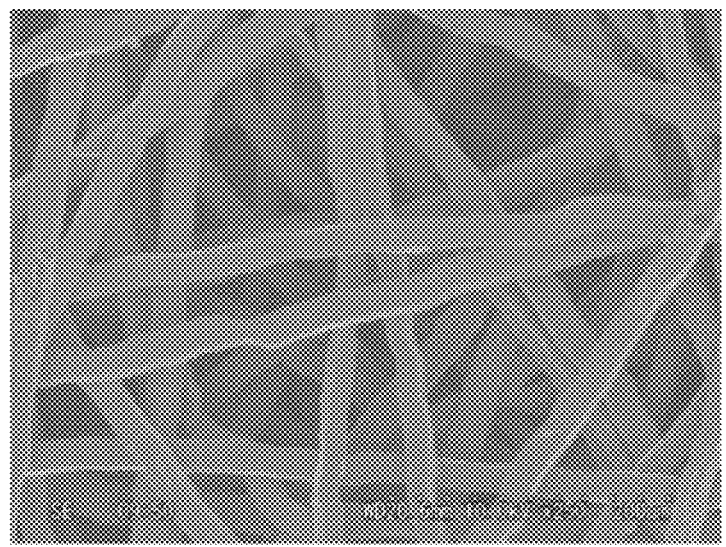
FIG. 8 is the photograph of a scanning electron microscope image of a metallic abrasive pad made up of a titanium fiber 20 μm in diameter, having a void ratio at 78%, according to the working example 2.

FIG. 8 shows the photograph of a scanning electron microscope image of the metallic abrasive pad manufactured as above, having the void ratio at 78%. Further, with respect to the metallic abrasive pad having the void ratio at 78%, a compression recovery ratio was measured, and as a result, the compression recovery ratio was found at 97%

Working Example 3

Figure 9:
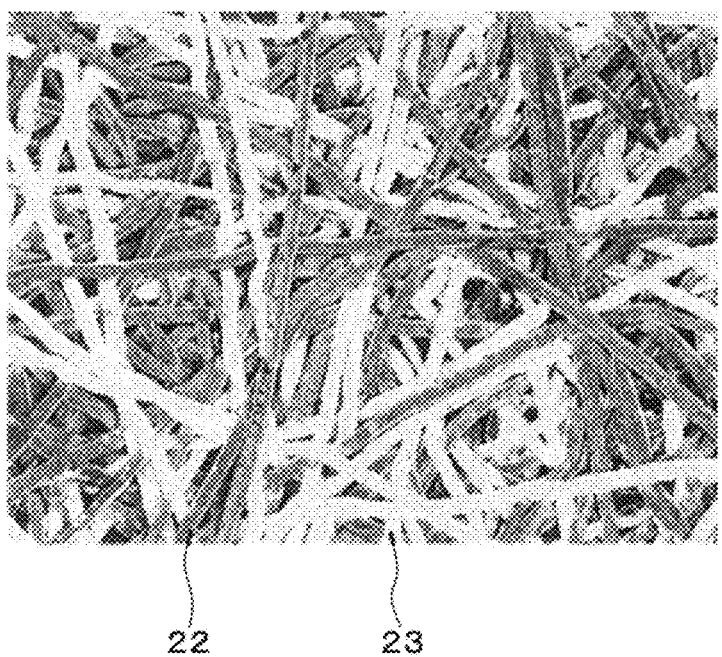
FIG. 9 is the photograph of a scanning electron microscope image of a metallic abrasive pad made up of both a titanium fiber and a nickel fiber, 20 μm in diameter, according to the working example 3.

A metallic abrasive pad was manufactured by the same method as in the case of Working Example 1, using a nickel fiber (the first metal fiber) and a titanium fiber (the second metal fiber). FIG. 9 shows the photograph of a scanning electron microscope image of the metallic abrasive pad manufactured as above. It can be confirmed from FIG. 9 that the metallic abrasive pad is made up of the nickel fiber 22 and the titanium fiber 23.

Working Example 4

The smoothing operation according to the catalyst-supported chemical machining method was applied to the workpiece, using the metallic abrasive pad manufactured in Working Example 1, inside the chemical machining unit described in the first embodiment of the invention. Table 4 shows an operating condition in this case.

TABLE 4

| metallic abrasive pad | metallic abrasive pad, a void ratio at 36% |
|---|---|
| Abrasive pad diameter | 200 mm |
| Abrasive pad rotational speed | r.p.m 90 |
| Abrasion load | 4 kg |
| Oxidizer | Pure water |
| Oxidizer feed-rate | 10 ml/min |
| Oxidizer temperature | 20 to 23° C. |
| Supplementary abrasive particle | High-purity alumina manufactured by FUJIMI Co, Ltd. Product No.: WA#30000 |
| Supplementary abrasive particle concentration | 0.1 g/ml |
| Supplementary abrasive particle feed rate | 5 ml/min |
| Workpiece | SiC wafer manufactured by TankeBlue Corp. Product No.: 4H-N diameter.: 2 in., thickness: 400 µm Worked surface: Si face |

Figure 10A:
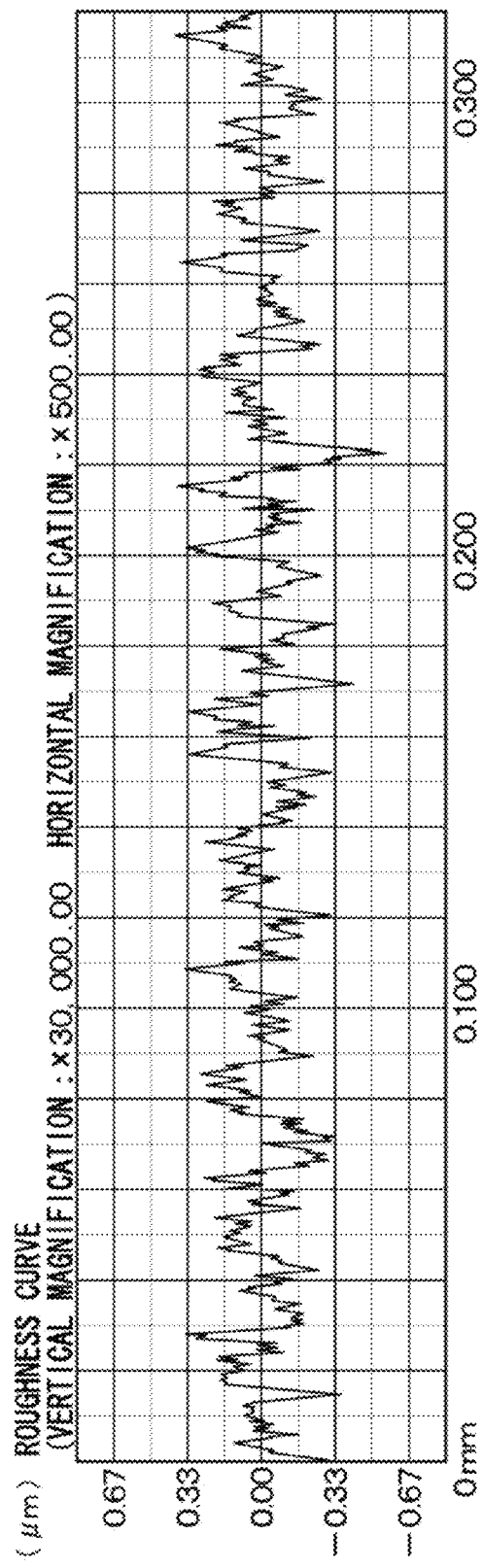
FIG. 10(a) shows a roughness curve of an SiC wafer surface before machining is applied to an SiC wafer.

FIGS. 10(a), 10(b) show respective roughness curves of an SiC wafer surface before and after application of the smoothing operation, at a time when the smoothing operation according to the catalyst-supported chemical machining method, using the metallic abrasive pad manufactured according to Working Example 1, was applied to the Si face of the SiC wafer regarded as a difficult-to-machine material. FIG. 10(a) shows the roughness curve before the application of the smoothing operation, and FIG. 10(b) shows the roughness curve after the application of the smoothing operation. Upon comparison of the roughness curve before the application of the smoothing operation with the roughness curve after the application of the smoothing operation, it is evident that the shape of each crest in the roughness curve has varied in shape from an acute angle to a round shape, whereas the shape of each trough in the roughness curve is kept in an acute angle. Accordingly, it can be confirmed from the respective roughness curves before and after the application of the smoothing operation that only projections in the roughness of the SiC wafer surface before the application of the smoothing operation was selectively processed.

This demonstrates that, in the case of a common polishing with the use of diamond slurry, the roughness of an SiC wafer surface, including both the projection and the recess, is simultaneously processed, thereby requiring a high processing charge until the target surface-roughness is attained, however, with the method for processing the SiC wafer, using the metallic abrasive pad according to the invention, it is possible to selectively process only the projection, so that processing can be implemented without requiring the high processing charge, proving that this processing is efficient.

Figure 11A:
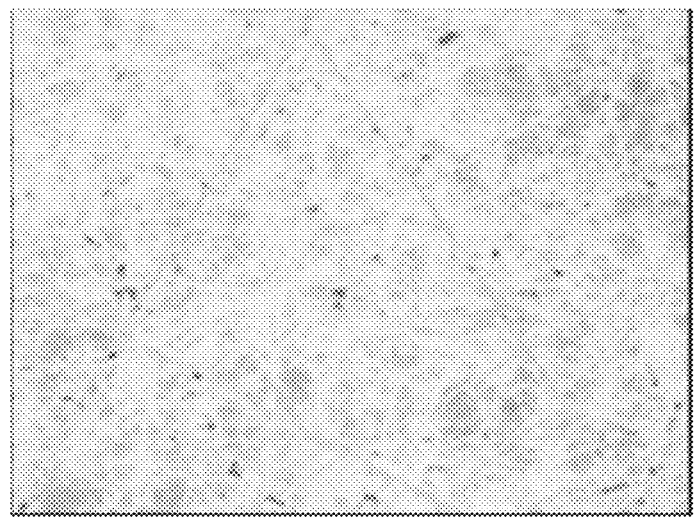
FIG. 11(a) shows an observation photograph of an SiC wafer surface before machining is applied to the SiC wafer, taken by a laser microscope.
Figure 11B:
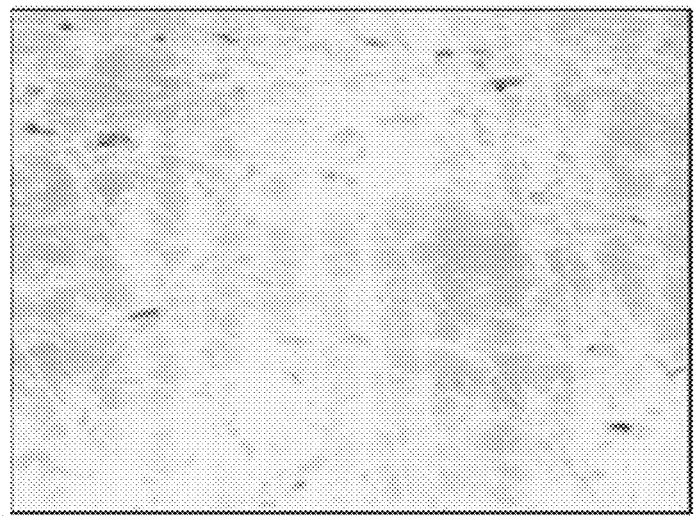
FIG. 11(b) shows an observation photograph of an SiC wafer surface after machining is applied to the SiC wafer, using the metallic abrasive pad according to working example 1, the observation photograph being taken by the laser microscope.

FIGS. 11(a), 11(b) show respective observation photographs of an SiC wafer surface before and after application of the smoothing operation, taken by a laser microscope, at a time when the smoothing operation according to the catalyst-supported chemical machining method, using the metallic abrasive pad manufactured according to Working Example 1, was applied to the surface of a difficult-to-machine material. FIG. 11(a) shows a surface state before the smoothing operation, and FIG. 11(b) shows the surface state after the smoothing operation. Upon comparison of the surface state before the smoothing operation with the surface state after the smoothing operation, it can be observed that a large number of linear traces exist on the SiC wafer surface before the smoothing operation, whereas the linear traces decreases in number after the smoothing operation, and a number of smoothed surfaces can be seen on the SiC wafer surface.

Incidentally, in the case of the common polishing with the use of diamond slurry, linear traces are left out without fail on a smoothed surface, as well, the linear traces being ones having occurred due to damages inflicted by diamond particles.

In contrast, with the method for processing the SiC wafer, using the metallic abrasive pad according to the invention, the linear trace does not exist at all on the smoothed surface, as shown in FIG. 11(b). The reason for this is because the processing of the SiC wafer is mostly implemented by chemical action, thereby proving that the surface of the SiC wafer can be formed without causing any defect attributable to the processing, at all, having no defect, that is, without a damage.

Figure 11C:
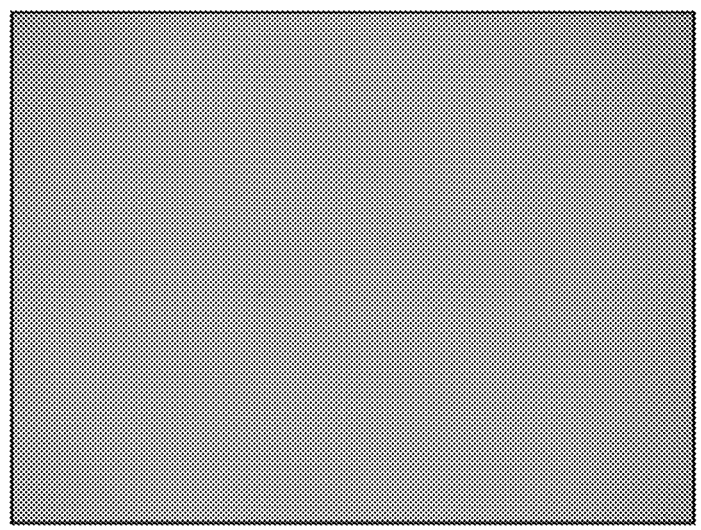
FIG. 11(c) shows an observation photograph of an SiC wafer surface after further machining is applied to the SiC wafer, using the metallic abrasive pad according to working example 1, the observation photograph being taken by the laser microscope.

FIGS. 10(c), 11(c) show the roughness curve of the SiC wafer surface, and an observation photograph of the SiC wafer surface, obtained by the laser microscope, after further application of the smoothing operation to the SiC wafer surface in states shown in FIGS. 10(b), 11(b), respectively. It is evident that the flatness of the SiC wafer surface is increased by further application of the smoothing operation, as shown in FIGS. 10(c), 11(c), respectively.

Working Example 5

Figure 12:
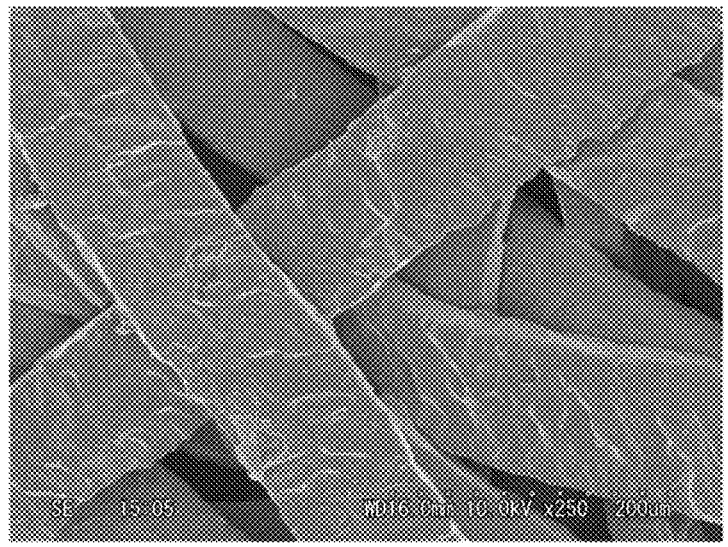
FIG. 12 is the photograph of a scanning electron microscope image of a metallic abrasive pad made up of a titanium fiber 80 μm in diameter, having a void ratio at 56%, according to working example 5.

A metallic abrasive pad having a void ratio at 56% was manufactured by the same method as in the case of Working Example 1, using a metal fiber made of pure titanium, 80 μm in diameter. FIG. 12 shows a photograph of a scanning electron microscope image of the metallic abrasive pad manufactured as above.

Working Example 6

Figure 13:
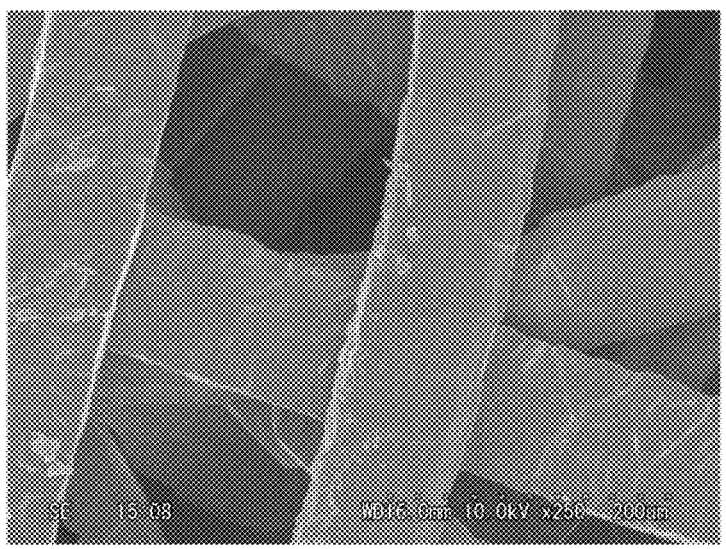
FIG. 13 is the photograph of a scanning electron microscope image of a metallic abrasive pad made up of a titanium fiber 80 μm in diameter, having a void ratio at 78%, according to the working example 6.

A metallic abrasive pad having a void ratio at 78% was manufactured by the same method as in the case of Working Example 1, using a metal fiber made of pure titanium, 80 μm in diameter. FIG. 13 shows a photograph of a scanning electron microscope image of the metallic abrasive pad manufactured as above.

As is evident from the description given as above, with the present invention, it is possible to cause the active species having high oxidizability, forced to occur from the oxidizer, to efficiently come into contact with the worked surface of a workpiece or to come in extreme proximity thereto, by processing the surface of a difficult-to-machine material with the use of the catalyst-supported chemical machining method, using the metallic abrasive pad made up of the metal fiber. Thus, the invention can provide a polishing method not only high in processing rate but also capable of causing the surface of a workpiece material (a workpiece) to have no defect at all.

INDUSTRIAL APPLICABILITY

The catalyst-supported chemical machining method, using the metallic abrasive pad according to the invention, is suitable for use in machining of a difficult-to-machine material, such as SiC, GaN, diamond, sapphire, and ruby, etc., used as a power semiconductor-material, in particular.

LIST OF REFERENCE SIGNS

1: board
2: metallic abrasive pad
2a: abrasion surface
21: metal fiber (catalyst)
3: holder
4: first nozzle
5: second nozzle
6: workpiece
6a: worked surface
10: 4primary formed compact
11: forming material
12: coating material
13: cushion sheet

The invention claimed is:

1. A metallic abrasive pad for use in a smoothing operation applied to a worked surface of a workpiece by a catalyst-supported chemical machining method, the metallic abrasive pad comprising:
    a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio,
    wherein the one or more metal fibers includes metal or alloy, the metal being selected from the group consisting of nickel, copper, iron, and platinum, the alloy being a combination of at least two selected from the group consisting of nickel, copper, iron, and platinum.

2. A metallic abrasive pad for use in a smoothing operation applied to a worked surface of a workpiece by a catalyst-supported chemical machining method, the metallic abrasive pad comprising:
    a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio,
    wherein the compression-formed compact is provided with a first one or more metal fibers, and a second one or more metal fibers differing in material from the first one or more metal fibers.

3. The metallic abrasive pad according to claim 2, wherein the one or more metal fibers has a diameter falling in a range of 1 μm to 500 μm.

4. The metallic abrasive pad according to claim 2, wherein the void ratio is not less than 10%, and not more than 90%.

5. The metallic abrasive pad according to claim 2, wherein the compression-formed compact has a compression recovery ratio falling in a range of 90% to 100%.

6. A metallic abrasive pad for use in a smoothing operation applied to a worked surface of a workpiece by a catalyst-supported chemical machining method, the metallic abrasive pad comprising:
    a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio,
    wherein the compression-formed compact has one face serving as an abrasion surface, and another face provided on the opposite side of the one face, and
    wherein a cushion sheet having rubber elasticity is provided on the another face.

7. A method for manufacturing metallic abrasive pad, the metallic abrasive pad comprising:

a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio, the method comprising:
a primary forming for applying hot pressing to a one or more metal fibers made of a transition-metal catalyst to form a primary formed compact; and
a secondary forming for applying isostatic pressing to the primary formed compact at an ordinary temperature to form a secondary formed compact,
wherein the one or more metal fibers is fixed to each other by means of sintering in the primary forming, and
in the secondary forming, the isostatic pressing is applied in a state where one face of the primary formed compact is covered with a forming material that is undeformable at a hydrostatic pressure, and a remaining face of the primary formed compact is covered with a coating material that is deformable at a hydrostatic pressure.

8. A catalyst-supported chemical machining method for applying a smoothing operation to a worked surface of a workpiece made of a difficult-to-machine material, comprising:
putting an abrasion surface of metallic abrasive pad and the worked surface together by pressing, the metallic abrasive pad comprising a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio; and
causing the workpiece and the metallic abrasive pad to undergo relative displacement, while feeding an oxidizer between the worked surface and the abrasion surface.

9. The catalyst-supported chemical machining method according to claim 8, wherein a supplementary abrasive particle and the oxidizer are fed together.

10. The catalyst-supported chemical machining method according to claim 9, wherein a material softer than the workpiece is used for the supplementary abrasive particle.

11. The catalyst-supported chemical machining method according to claim 10, wherein the supplementary abrasive particle is harder than a surface modification layer of the workpiece.

12. The catalyst-supported chemical machining method according to claim 8, wherein the difficult-to-machine material is any one selected from a group consisting of SiC, GaN, diamond, sapphire, and ruby.

13. The catalyst-supported chemical machining method according to claim 8, wherein a solution is selected from a group consisting of pure water, aqueous hydrogen peroxide, oxalic acid, and hydrofluoric acid, or mixed solution made up of combination of at least two selected from the afore described group, which is used for the oxidizer.

14. A metallic abrasive pad for use in a smoothing operation applied to a worked surface of a workpiece by a catalyst-supported chemical machining method, the metallic abrasive pad comprising:
a compression-formed compact of one or more metal fibers made of a transition-metal catalyst, wherein a contact spot of the one or more metal fibers intersecting each other is sintered, the one or more metal fibers are fixed to each other, and the metallic abrasive pad has a prescribed void ratio,
wherein the compression-formed compact is formed into a compact by applying heating and compression to the one or more metal fibers in a flocculent state.

15. The method according to claim 7, wherein
the one or more metal fibers are made of titanium, and
heating temperature is set to not lower than 700° C. and not higher than 1000° C. in the primary forming.

16. The metallic abrasive pad according to claim 2, wherein the one or more metal fibers includes metal or alloy, the metal being selected from the group consisting of nickel, copper, iron, chromium, cobalt, titanium, and platinum, the alloy being a combination of at least two selected from the group consisting of nickel, copper, iron, chromium, cobalt, titanium, and platinum.

* * * * *